US008652266B2

(12) United States Patent
Mikhaylichenko et al.

(10) Patent No.: US 8,652,266 B2
(45) Date of Patent: Feb. 18, 2014

(54) METHOD AND APPARATUS FOR SURFACE TREATMENT OF SEMICONDUCTOR SUBSTRATES USING SEQUENTIAL CHEMICAL APPLICATIONS

(75) Inventors: Katrina Mikhaylichenko, San Jose, CA (US); Yizhak Sabba, Castro Valley, CA (US); Dragan Podlesnik, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 917 days.

(21) Appl. No.: 12/212,559

(22) Filed: Sep. 17, 2008

(65) Prior Publication Data

US 2010/0018553 A1 Jan. 28, 2010

Related U.S. Application Data

(60) Provisional application No. 61/083,498, filed on Jul. 24, 2008.

(51) Int. Cl.
 *B08B 3/00* (2006.01)
(52) U.S. Cl.
 USPC ............ 134/26; 134/28; 134/32; 134/34; 134/41
(58) Field of Classification Search
 USPC ......... 134/2, 3, 10, 26, 28, 29, 32, 34, 36, 41, 134/42; 438/745
 See application file for complete search history.

(56) References Cited

U.S. PATENT DOCUMENTS

| | | | | |
|---|---|---|---|---|
| 6,129,091 A | * | 10/2000 | Lee et al. | 134/3 |
| 2006/0124153 A1 | * | 6/2006 | Yun et al. | 134/2 |

OTHER PUBLICATIONS

International Search Report—PCT/US2009/004080—dated Jan. 27, 2010 (3 pages).

* cited by examiner

*Primary Examiner* — Eric Golightly
(74) *Attorney, Agent, or Firm* — Martine Penilla Group, LLP

(57) ABSTRACT

A system and method for removing polymer residue from around a metal gate structure formed on a surface of a substrate during a post-etch cleaning operation includes determining a plurality of process parameters associated with the metal gate structure and the polymer residue to be removed. A plurality of fabrication layers define the metal gate structure and the process parameters define characteristics of the fabrication layers and the polymer residue. A first cleaning chemistry and second cleaning chemistry are identified and a plurality of application parameters associated with the first and second cleaning chemistries are defined based on the process parameters. The first and second application chemistries are applied sequentially in a controlled manner using the application parameters to substantial remove the polymer residue while preserving the structural integrity of the gate structure.

11 Claims, 10 Drawing Sheets

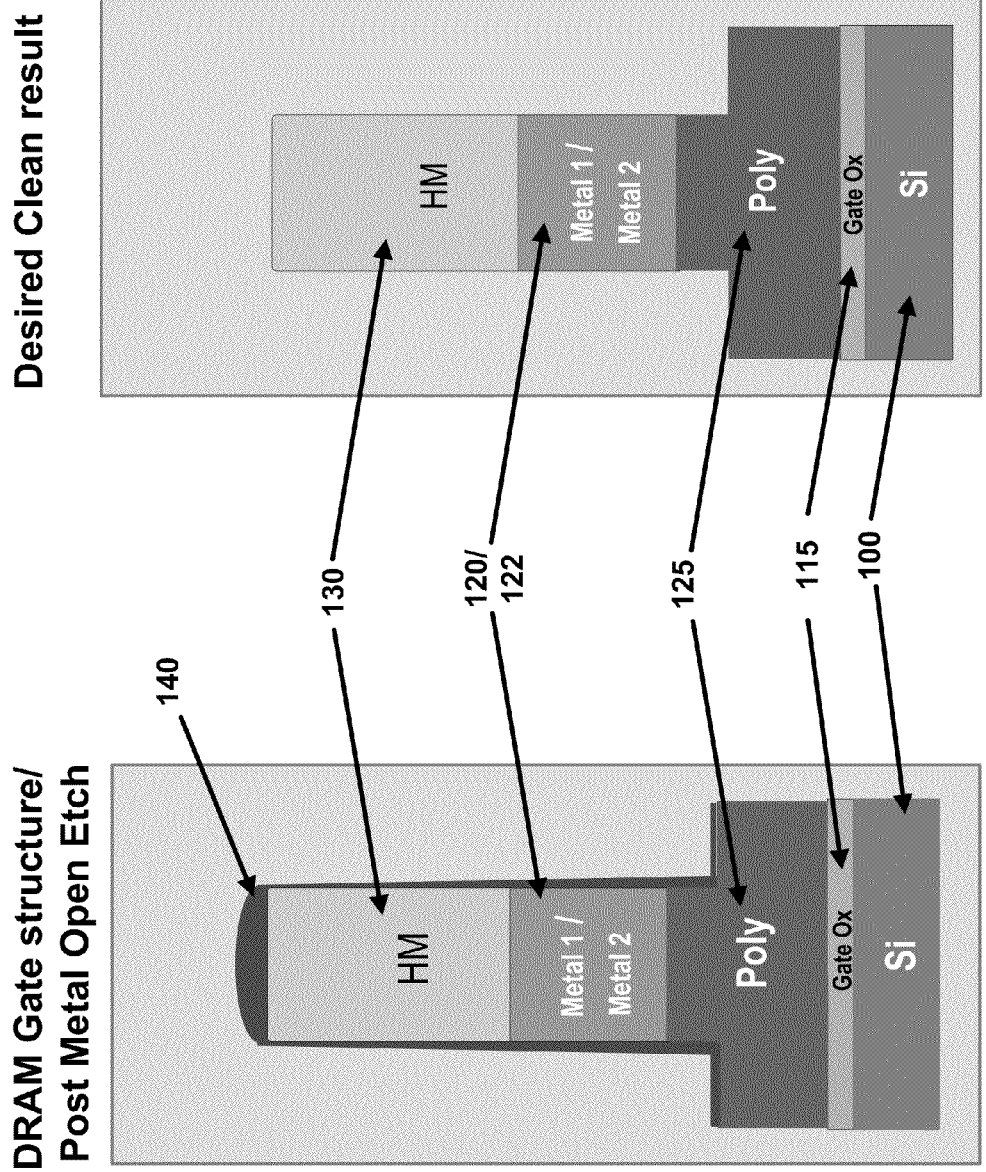

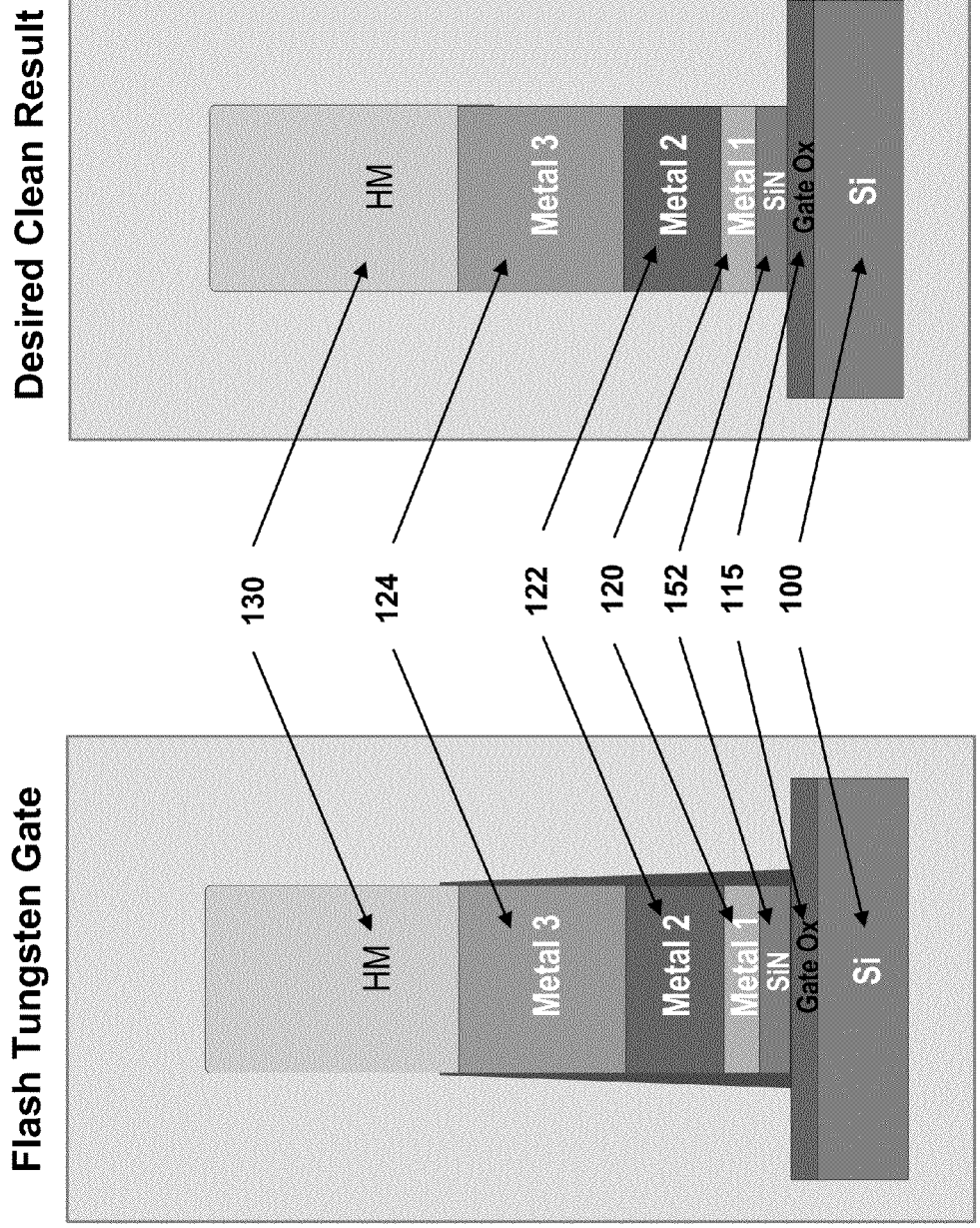

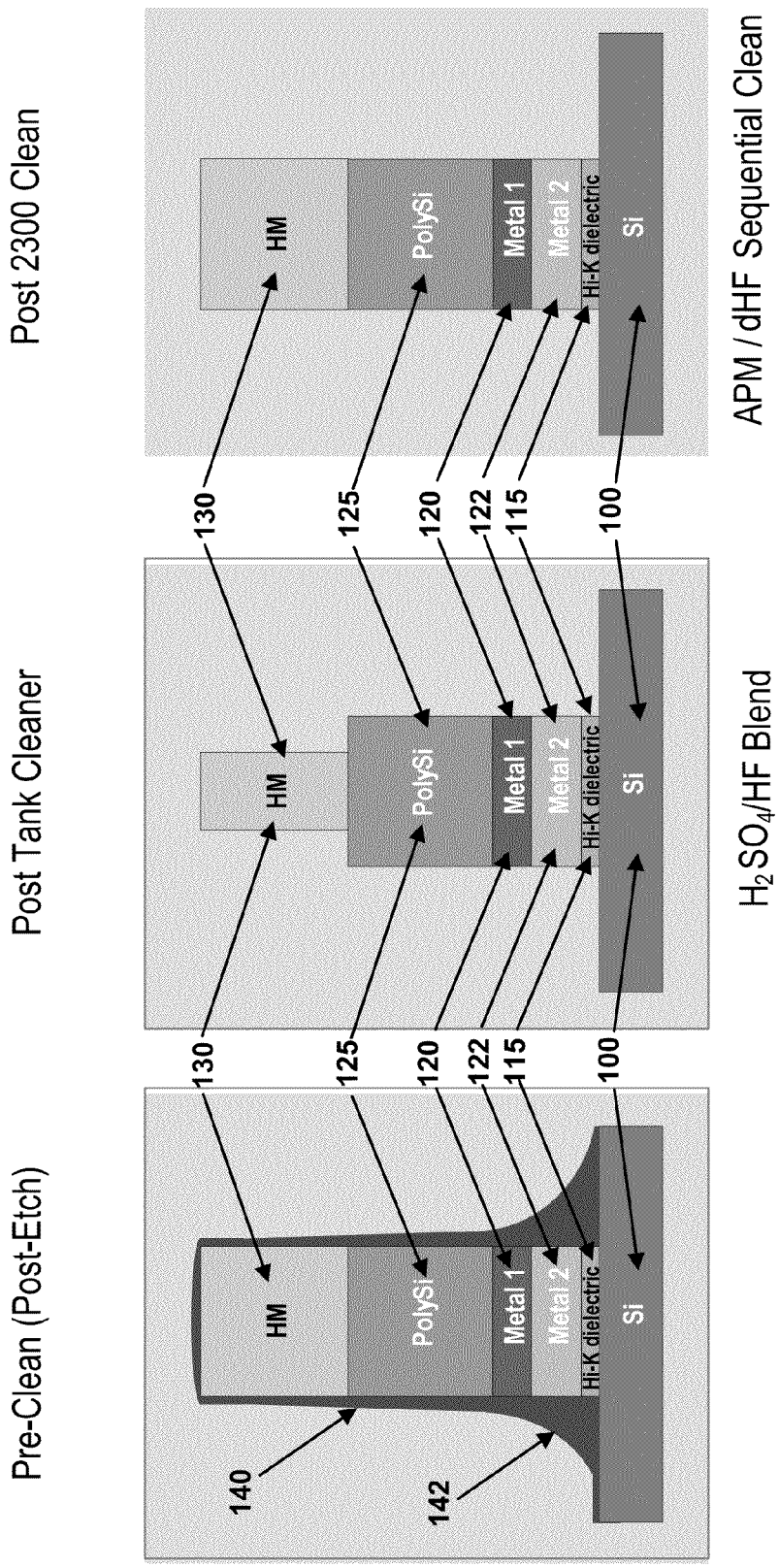

METHOD AND APPARATUS FOR SURFACE TREATMENT OF SEMICONDUCTOR SUBSTRATES USING SEQUENTIAL CHEMICAL APPLICATIONS

CLAIM OF PRIORITY

Cross Reference to Related Applications

This application claims priority over U.S. Provisional application No. 61/083,498, filed on Jul. 24, 2008, and entitled "Method and Apparatus for Surface Treatment of Semiconductor Substrates using Sequential Chemical Applications," which is incorporated herein by reference.

FIELD OF THE INVENTION

The present invention relates generally to semiconductor substrate processing, and more particularly, to systems and methods for treating a surface of a semiconductor substrate using sequential chemical applications.

DESCRIPTION OF THE RELATED ART

Semiconductor devices are obtained through various fabrication operations. The fabrication operations define a plurality of features, such as gate structures, on semiconductor wafers (wafers or substrates) that span multi-levels. During the various fabrication operations, the substrate is exposed to various contaminants. Any material or chemical used in the fabrication operations to which the substrate is exposed is a potential source of contamination. Chemicals used in the various fabrication operations, such as etching, deposition, etc., leave deposit, such as process gases, etching chemicals, deposition chemicals, etc., on and around features, such as gate structures, formed on the surface of the substrate, as particulates or polymer residue contaminants. The sizes of the particulate contaminants are in the order of the critical dimensions of the features being fabricated on the substrate. These contaminants lodge on the top, along the side walls and in between the features in hard-to-reach areas, such as in a trench surrounding the delicate features, and may likely cause damage to the features within the vicinity of the contaminant particles.

A typical gate structure formed on a substrate may include a stack of layers made of different materials defining the gate structure. The gate structure may include a layer of gate oxide over which an electrode is fabricated using one or more layers of metal, such as tungsten, tungsten compounds, etc. The metal that may be used in fabricating the electrode may include tungsten, tungsten silicide, tungsten nitride, tantalum, polysilicon, silicon oxide, aluminum oxide, hafnium oxide, silicon oxynitride, tantalum nitride, etc. A layer of polysilicon is formed on top of the metal layer and a hardmask layer is fabricated over the top of the polysilicon layer. The hardmask layer is fabricated as a photoresist layer and is used to pattern the gate stack and preserve the underlying layers. During an etching operation, etching chemicals used in patterning the hardmask and the underlying layers leave polymer residue on top and along the sidewalls of the gate structure. Conventional polymer residue cleaning methods have relied on batch tools that expose the polymer residues to cleaning chemistries for a prolonged period of time. When a less aggressive cleaning chemistry is used, the exposure results in inefficient removal of polymer residues and other contaminants. On the other hand, when a more aggressive chemistry is used, the exposure using the batch tools leads to high material loss rates at the gate structure rendering the cleaning process undesirable. The material loss includes pullback of the hardmask layer and/or undercut of gate oxide and other layers of the gate structure formed on the substrate. FIG. 1 illustrates a typical gate structure and FIG. 2 illustrates an example of some of the negative effects experienced at various layers of the gate structure.

FIG. 1 illustrates a typical metal gate structure formed on a substrate 100 by various fabrication operations. An etching operation is used to form various layers of the gate structure thereby defining a gate stack. The gate structure includes a layer of gate oxide 115 formed on the substrate 100. The substrate 100 includes a source/drain region 105 over which the layer of gate oxide 115 (usually of high dielectric constant) is formed. A metal electrode is fabricated over the gate oxide 115 using one or more layers of metal. In the metal gate structure illustrated in FIG. 1, the metal electrode is formed using a layer of metal 1 120 and a layer of metal 2 122. A polysilicon layer 125 is formed over the metal layer and a hardmask layer is formed over the polysilicon layer. The hardmask layer may further include one or more layers of hardmask. As depicted in FIG. 1, the hardmask layer includes 3 layers of hardmask, mask 1 130, mask 2 132, and mask 3 134. The etched materials and the etching chemicals used in the etching operation to define the stack deposit metallic or polymer contaminants on the top and sidewalls of the gate structure. Typical contaminants include polymer residues 140 and metal containing polymer residues 142.

FIG. 2 illustrates some of the potential issues experienced at the gate structure as a result of a cleaning process using a traditional batch tool. The prolonged exposure of the gate structure to aggressive cleaning chemistry used in the batch tool results in the erosion of the hardmask, otherwise known as hardmask pullback. The hardmask erosion results in the premature exposure of the underlying layers leading to potential damage and/or further contamination of the gate features. The prolonged exposure to the cleaning chemistry may further result in the undercut of the metal layer, such as tungsten, tungsten silicide, etc., used in forming the metal electrode over the gate oxide eventually exposing the gate oxide to the cleaning chemistry. The pullback of the hardmask and the undercut of the metal and other layers of the gate structure including the gate oxide pose the greatest problems in the cleaning process. The premature exposure of the various layers of a gate stack to chemistries used in subsequent fabrication operations may result in further damage of the layers lending the gate structure inoperable. Efficient and non-damaging removal of contaminants during fabrication poses a great challenge in the cleaning process.

In view of the foregoing, a more effective cleaning technology is needed in removing the contaminants from the surface of the substrate while preserving the structural integrity of the gate structure. It is in this context embodiments of the invention arise.

SUMMARY

The present invention fills the need by providing improved methods and apparatus for efficiently removing polymer residue contaminants formed around a metal gate structure on the surface of the substrate. It should be appreciated that the present invention can be implemented in numerous ways, including an apparatus and a method. Several inventive embodiments of the present invention are described below.

In one embodiment, a method for removing polymer residues from around a metal gate structure during a post-etch cleaning operation, is disclosed. The method includes determining a plurality of process parameters associated with a metal gate structure and the polymer residue formed around the gate structure. The gate structure includes one or more layers of fabrication. The process parameters define one or more characteristics of the one or more fabrication layers comprising the gate structure and of the polymer residue formed around the gate structure. A first and a second cleaning chemistry, to treat the surface of the substrate, are identified. One or more application parameters for each of the first and second cleaning chemistries are defined based on the process parameters. The first and second cleaning chemistries are applied sequentially to a portion of the surface of the substrate using the application parameters in a controlled manner so as to provide an optimal exposure of the portion of the surface of the substrate to the first and second cleaning chemistries for an optimal period of time such that the polymer residues are substantially removed from around the gate structure while preserving the structural integrity of the one or more layers of the gate structure.

In another embodiment, a system for removing polymer residue from around a metal gate structure formed on a surface of a substrate during a post-etch cleaning operation, is defined. The system includes a substrate supporting device to receive, support and transport the substrate through the system. A first proximity head is configured to introduce a first cleaning chemistry to a portion of the surface of the substrate as a meniscus. A second proximity head is configured to introduce a second cleaning chemistry to the portion of the surface of the substrate as a meniscus. The introduction of the first and second cleaning chemistries sequentially through the first and second proximity heads enables application of the first and second cleaning chemistries in a controlled manner to the portion of the surface of the substrate so that the portion of the surface of the substrate is optimally exposed to the first and second cleaning chemistries for an optimal period of time for substantial removal of the polymer residue formed around the metal gate structure while the structural integrity of the one or more layers of the gate structure is maintained.

Other aspects and advantages of the invention will become more apparent from the following detailed description, taken in conjunction with the accompanying drawings, illustrating by way of example the present invention.

BRIEF DESCRIPTION OF THE DRAWINGS

The invention may best be understood by reference to the following description taken in conjunction with the accompanying drawings. These drawings should not be taken to limit the invention to the preferred embodiments, but are for explanation and understanding only.

FIGS. 3A-3D illustrate simplified schematic diagrams of various gate structures after etching operation. FIG. 3A illustrates a simplified DRAM gate structure after full etch, in one embodiment of the invention. FIG. 3B illustrates a simplified DRAM gate structure after partial etch, in another embodiment of the invention. FIG. 3C illustrates a simplified Flash tungsten gate structure after an etching operation, in another embodiment of the invention. FIG. 3D illustrates a simplified tungsten gate Logic structure after an etching operation, in another embodiment of the invention.

FIG. 3E illustrates a simplified schematic diagram of a tungsten metal gate structure after a typical tank cleaning operation, in one embodiment of the invention.

FIGS. 4A-4C illustrate simplified schematic diagrams of desired cleaning results expected for various gate structures illustrated in FIGS. 3A-3C after a cleaning operation.

FIG. 4D illustrates a resultant metal gate structure after a cleaning operation using a first cleaning chemistry and second cleaning chemistry, in one embodiment of the invention.

DETAILED DESCRIPTION

Several embodiments for effectively removing polymer residues, including metal containing polymer residues, from around a metal gate structure formed on a surface of a substrate will now be described. It will be obvious, however, to one skilled in the art, that the present invention may be practiced without some or all of these specific details. In other instances, well known process operations have not been described in detail in order not to unnecessarily obscure the present invention.

Effective removal of contaminants, such as polymer residues and metal containing polymer residues, from the surface of a substrate helps in retaining the functionality of the features formed on the substrate and the resulting devices, such as microchips. In one embodiment of the invention, the polymer residues formed around a metal gate structure are removed by sequentially applying aggressive chemistries to the surface of the substrate. The aggressive chemistries are applied in a very controlled manner so as to enable optimal removal of the polymer residue contaminants from around the gate structure while preserving the structural integrity of the gate structure. In order to apply the aggressive chemistries in a very controlled manner, a plurality of process parameters associated with the gate structure and the polymer residue are determined. The process parameters are obtained by analyzing the plurality of fabrication layers forming the gate structure and the various types of polymer residues formed around the gate structure feature. The process parameters define one or more characteristics associated with the different layers of the gate structure and the polymer residue. A first and a second aggressive chemistry are identified and one or more application parameters are defined for the identified aggressive chemistries based on the process parameters. The application parameters are used in applying the aggressive chemistries sequentially in a controlled manner so that optimal removal of polymer residues is enabled without losing the structural integrity of the gate structure.

The advantages of the various embodiments include use of simple, common chemistries to effectively remove the unwanted polymer residue resulting in a substantially clean device. The controlled application of the aggressive chemistries effectuates removal of polymer residue with precise control of critical dimension.

Figure 2:
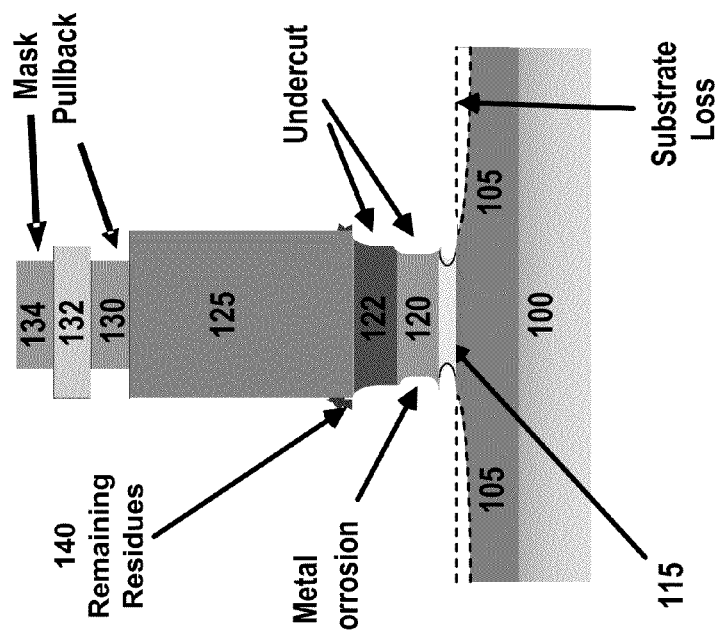
FIG. 2 illustrates a simplified schematic diagram of potential issues and damages experienced at the post-etch metal gate structure illustrated in FIG. 1 during cleaning operation, in one embodiment of the invention.
Figure 1:
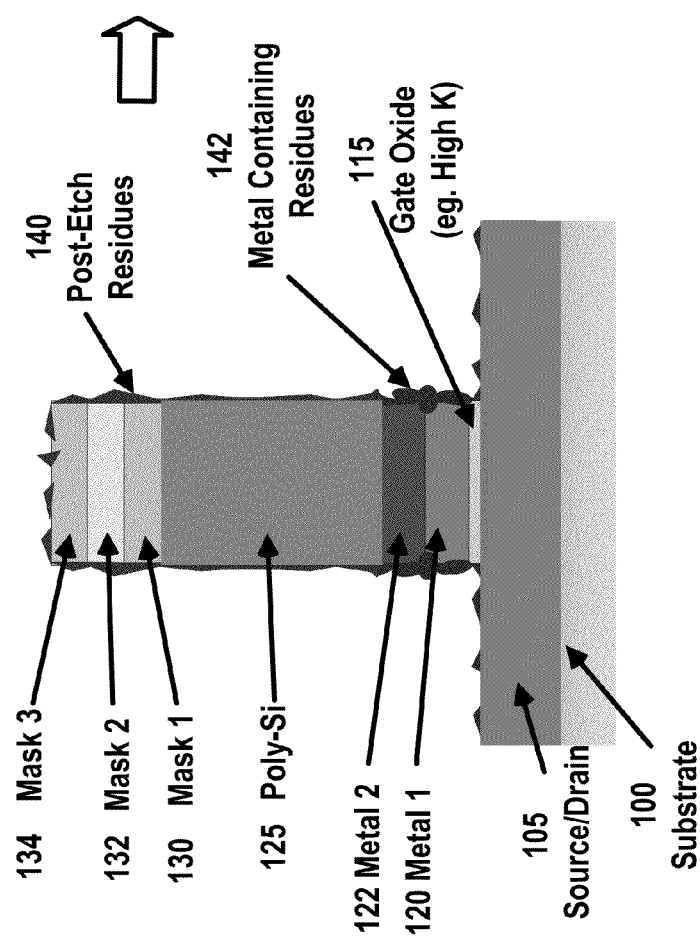
FIG. 1 illustrates a simplified schematic diagram of a typical post-etch metal gate structure, in one embodiment of the invention.

In order to understand the effectiveness of controlled application of the aggressive chemistries, the negative effects experienced at the gate structure will be first described with reference to FIGS. 1 and 2. FIG. 1 illustrates a simplified schematic diagram of a gate structure, in one embodiment of the invention. The gate structure is formed using a plurality of fabrication layers where fabrication materials are deposited over a surface of a substrate 100. The fabrication layers may include one or more layers of metal 120, 122 formed over a layer of gate oxide 115 on the surface of a substrate 100. The gate oxide layer 115 is usually a high dielectric constant film layer formed over the source/drain 105. Layers of metals are used to form a metal electrode. In FIG. 1, two layers of metal, Metal 1 120 and Metal 2 122, are used in forming the metal electrode. Some of the metals that are used for forming the metal electrode include Tungsten (W), Tungsten Silicide, Tungsten Nitride, Tantalum, poly-silicon (doped or undoped), Silicon Oxide ($SiO_2$) Tantalum Nitride (TaN), Hafnium Oxide, Aluminum Oxide, Nitrided Hafnium-silicate (HfSiON), etc. A polysilicon layer 125 is formed over the metals. A hardmask layer 130 is formed over the polysilicon layer 130. The hardmask layer 130 may be made up of a plurality of layers of hardmask 130, 132, 134. Typical materials used to form hardmask layers include Silicon Nitride, Silicon Oxide, etc. The hardmask layer is formed as a photoresist layer and is used to protect the underlying layers during an etching operation. During the etching operation, the etching chemicals used to define the metal gate structure will leave polymer residue contaminants 140 and metal containing polymer residue contaminants 142 on top and along the sidewalls of the metal gate structure. It is essential to remove the unwanted polymer residue contaminants 140, 142 while preserving the characteristics of the metal gate structure.

Figure 3A:
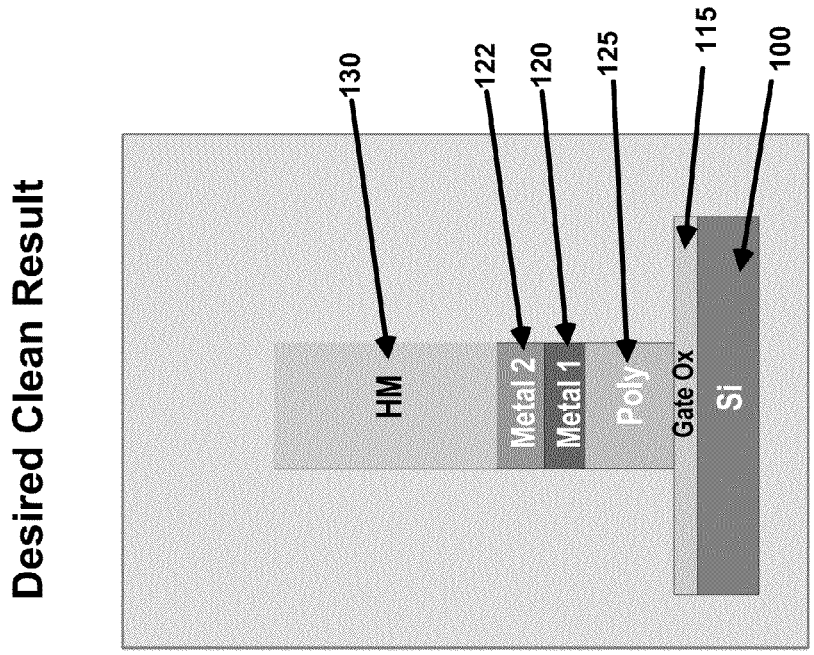

The gate structure illustrated in FIG. 1 is one example of a gate structure formed over the substrate. Variations of the gate structure are possible. FIGS. 3A-3D illustrate some variations of the gate structure illustrated in FIG. 1. FIG. 3A illustrates a DRAM gate structure after a full etch. A gate stack of the gate structure includes a gate oxide 115 formed over a silicon substrate 100. A poly silicon layer 125 is formed over the gate oxide 115 followed by a layer of metal 1 120 and a layer of metal 2 122. A hardmask layer 130 is formed over the metal 2 layer. As can be seen, after the etching operation post-etch polymer residues 140 and metal containing polymer residues 142 form around the gate structure. It is a challenge to get rid of the polymer residues formed around the gate structure without actually damaging the various layers of the gate structure.

FIG. 3B illustrates a variation of the gate structure shown in FIG. 3A. The gate structure in FIG. 3B is formed as a result of an open etch process with the poly silicon layer 125 formed over the entirety of the gate oxide 115 and the gate stack is formed over a portion of the poly silicon layer 125.

FIG. 3C illustrates an embodiment of a flash tungsten metal gate structure formed over the silicon substrate 100. The gate stack of the gate structure includes a gate oxide 115 formed over the substrate. A protective layer of silicon nitride 152 is formed over the gate oxide 115. Layers of metal 1, 120, metal 2, 122 and metal 3, 124, are formed on top of the silicon nitride layer 152. A hardmask layer 130 is formed on top of the metal layer 124.

FIG. 3D illustrates a post-etch gate structure formed over the silicon substrate 100, in one embodiment of the invention. As mentioned earlier with other gate structures, a high dielectric constant film layer 115 is formed over the silicon substrate, a plurality of metal layers, such as a layer of metal 2, 122, and metal 1, 120, are formed over the high dielectric constant film layer 115. The metal layers may be tungsten or tantalum based metal layers, such as tungsten, tungsten silicide, tantalum, tantalum nitride, etc. On top of the metal layers, a layer of poly silicon 125 is formed. On top of the poly silicon 125, a hardmask layer is formed. The various chemicals used in the etching operation deposit around the gate features as polymer residues 140. Removal of the post-etch polymer residues 140 including metal containing polymer residues 142 are challenging as the chemicals used to remove these residues during a cleaning operation, tend to damage one or more layers of the gate structure. FIG. 2 illustrates one such example of potential cleaning issues of mask pullback and undercut to the metal layers due to metal corrosion, when the traditional cleaning tools were used.

FIG. 3E illustrates another potential cleaning issue when a batch tool is used during cleaning operation. A batch tool, such as an immersion tank tool, (for example, Process of Record (POR) tank tool, is used to effectively remove the polymer residue contaminants. The batch tool exposes the substrate with the associated gate structure to the cleaning chemistry for effective removal of the polymer residue. Using a less aggressive chemistry in the tank tool leads to inefficient cleaning process. When a more aggressive chemistry is used in the tank tool, the gate structure experiences high material loss, as illustrated in FIG. 3E. The aggressive chemistry used to dissolve the metal containing polymer residue contaminant will also react with the hardmask layer severely eroding the hardmask layer thereby exposing the underlying layers of the gate structure to the aggressive cleaning chemistries during cleaning and post-cleaning process. The exposed layers of the gate structure may undergo severe damage from the aggressive cleaning and other fabrication chemicals resulting in a damaged or inoperable gate structure.

Conventional methods used an immersion tool to expose the surface of the substrate to cleaning chemistries. When a less aggressive cleaning chemistry is used in the immersion tool, the cleaning was inefficient with very poor profile control. On the other hand, when a more aggressive chemistry is used to treat the surface of the substrate, substantial damage to the fabrication layers occurs including pullback of the hardmask layer and undercut of the various fabrication layers, as illustrated in FIG. 2. This is due to the fact that the polymer residues on the sidewalls and on top of the gate structure contain metal. In order to effectively remove the metal containing polymer residues, aggressive chemistries are chosen such that the aggressive chemistries are capable of dissolving and/or removing the metal containing polymer residue during the cleaning operation. These aggressive chemistries, however, also react with the metal containing fabrication layers and the hardmask layers resulting in removing portions of hardmask layers (hardmask pull back) and undercutting portions of the metal containing fabrication layers of the gate structure. When there is a pullback in the hardmask layer, the underlying fabrication layers that form the gate structure are prematurely exposed to ambient environment which includes chemicals used in subsequent fabrication operations, leading to contamination or damage of the underlying layers. The contaminated/damaged underlying layers may render the resulting device inoperative. It is, therefore, beneficial to prevent the hardmask pullback while preserving the underlying fabrication layers that may otherwise prematurely expose the gate oxide layer to fabrication chemicals.

Figure 4A:
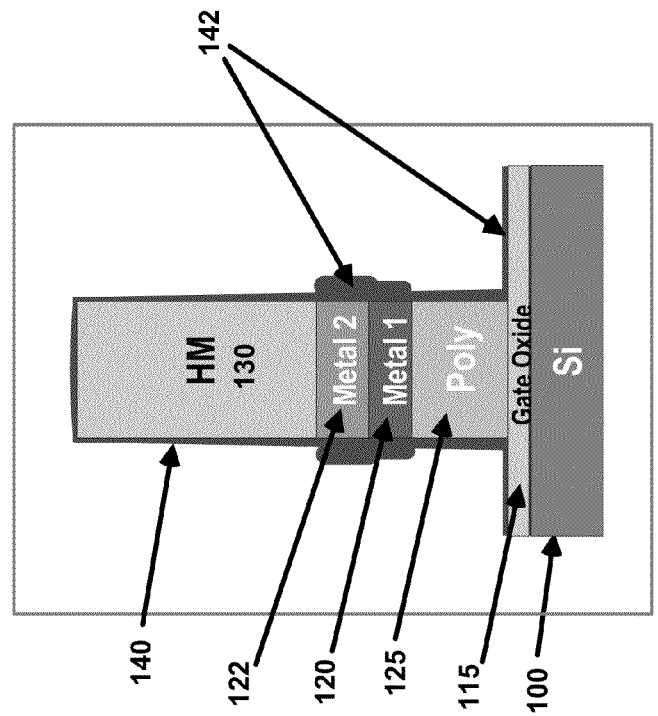

FIGS. 4A-4C illustrate the cleaning results desired from a cleaning operation for various gate structures depicted in FIGS. 3A-3C. The expected desired result preserves the various fabrication layers of the gate structure while effectively removing the polymer residue contaminants from around the gate structure. Towards this end, FIG. 4A illustrates the desired result expected after a cleaning operation for a full-etch gate structure illustrated in FIG. 3A, FIG. 4B illustrates the desired cleaning result for a open-etch gate structure illustrated in FIG. 3B and FIG. 4C illustrates the desired cleaning result for a tungsten metal gate structure illustrated in FIG. 3C. As can be seen, the desired results require effective removal of the polymer residue contaminants, including the metal containing residues, without damaging any of the fabrication layers.

Figure 5:
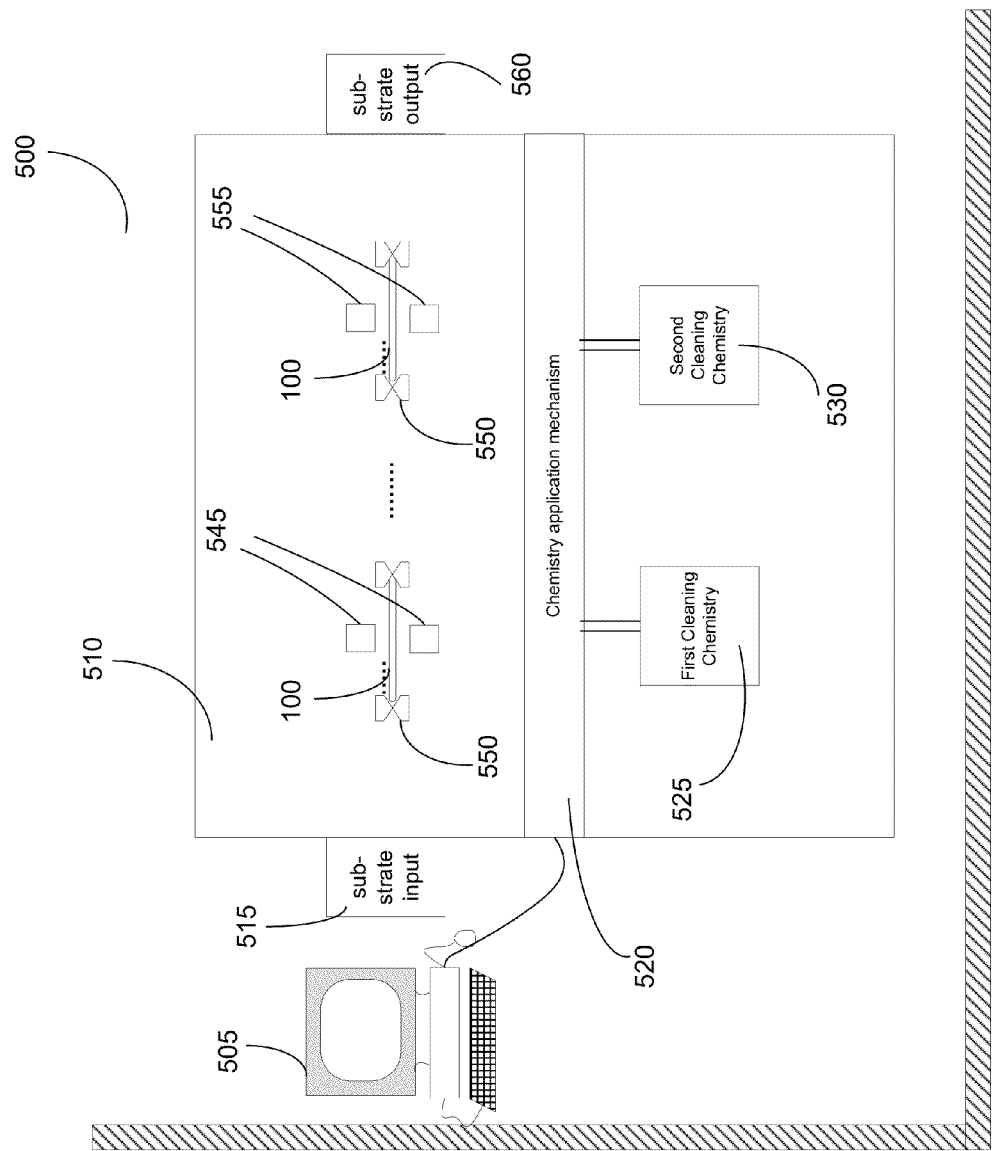
FIG. 5 illustrates a simplified schematic diagram of a system used in the application of first and second application chemistry to the surface of the substrate, in one embodiment of the invention.

FIG. 5 illustrates a system 500 within a clean room used to introduce a first cleaning chemistry and a second cleaning chemistry to a surface of a substrate 100 in a controlled manner to substantially remove polymer residues deposited around metal gate structures, in one embodiment of the invention. The system 500 includes a housing chamber 510 having a substrate supporting device, such as a carrier 550, to receive, support and transport a substrate through the housing chamber 510 on a selected plane. The substrate 100 is received at the substrate input region 515, transported through a region with one or more sets of proximity heads 545 and 555 and delivered to the substrate output region 560. The embodiment of FIG. 5 shows a pair of proximity heads positioned on either side of the selected plane through which the substrate 100 is transported, to deliver the first and second cleaning chemistries to both sides of the substrate 100. It should be noted that this configuration of proximity heads is exemplary and should not be construed as limiting. As a result, other combinations and configurations of proximity heads may also be considered for effective cleaning of the substrate 100.

The first set of proximity heads 545 are used to apply a first cleaning chemistry and the second set of proximity heads 555 are used to apply a second cleaning chemistry, respectively, as menisci to the surface of the substrate during a post-etch cleaning operation. The term, "meniscus," as used herein, refers to a volume of liquid bounded and contained in part by surface tension of the liquid. The meniscus, defining a contained chemical region, is controllable and can be moved over a surface in the contained shape. Furthermore, the meniscus shape can be controlled through a computing system 505 connected to the proximity heads 545 and 555. The system 510 may include reservoirs 525 and 530 to receive, hold and supply the first and second cleaning chemistries to the proximity heads, 545 and 555. A chemistry application mechanism 520 connected to the reservoirs 525 and 530 control the flow of the first and second cleaning chemistries through the proximity heads 545 and 555. The chemistry application mechanism 520 may include one or more precision controls to enable controlled delivery of the first and second cleaning chemistries to the proximity heads 545 and 555. The precision controls may be remotely controlled by the computing system 505. Software in the computing system 505 may be used to manipulate the precision controls such that proper amount of first and second application chemistries are supplied to the proximity heads at appropriate stages of the cleaning process. A plurality of process parameters associated with the various fabrication layers and the polymer residue contaminants is used to manipulate the delivery controls so that adequate amounts of the first and second cleaning chemistries are delivered to the proximity heads.

The application of the first and second cleaning chemistries is based on the plurality of process parameters. The process parameters are obtained by analyzing various fabrication layers that form the gate structure and the polymer residues that need to be removed. The process parameters define characteristics of each of the fabrication layers and the polymer residue. Some of the process parameters associated with each of the fabrication layers at the gate structure include one or more of type, size, and composition. Some of the process parameters associated with the polymer residue removal may include chemistry type, concentration, temperature, exposure time, and target removal rate on semiconductor materials used in the process of gate manufacturing. Some of the semiconductor materials used in the process of gate manufacturing may include Silicon oxide ($SiO_2$), Tungsten (W), Tungsten silicide, Tungsten Nitride, Tantalum Nitride, Tantalum, and others. The first cleaning chemistry and second cleaning chemistry are selected based on the process parameters so that the polymer residue contaminants are effectively and substantially removed without damaging the gate structure feature. The process parameters associated with the fabrication layers and polymer residues may vary from one substrate to the next. It is essential to preserve the gate structure formed on the surface of the substrate during the cleaning operation so that the functionality of the gate structure and that of the semiconductor device is maintained.

The first and second cleaning chemistries that are selected based on process parameters are aggressive chemistries that are normally not used in traditional tools during the cleaning operation. These aggressive chemistries are known to cause considerable damage to the features formed on the substrate 100 when exposed over an extended period of time. However, these aggressive chemistries facilitate effective removal of polymer residues formed around the gate structures when applied in a controlled manner for a limited amount of time. In one embodiment, the first cleaning chemistry is ammonium peroxide mixture (APM) and the second cleaning chemistry is diluted Hydrofluoric acid (dHF). APM is an effective cleaning chemistry as it is known to interact with metal containing polymer residues effectively removing them from around features formed on the substrate. However, as mentioned earlier, APM is also known to be an aggressive chemistry with high removal rates for tungsten and tungsten containing compounds making it difficult to use it as an effective cleaning chemistry for cleaning tungsten containing device stacks, such as the gate structures, in conventional batch cleaning tools. In order to avoid damage to the fabrication layers of the gate structure, especially the ones that contain tungsten/tungsten compounds, the first and second cleaning chemistries are applied in a very controlled manner using the proximity heads 545 and 555, respectively, so as to limit the exposure of the surface of the substrate to the cleaning chemistries. The length and precise exposure time using proximity heads may be driven by a desired target removal rate of the polymer residue so as to enable one to define acceptable amount of metal film loss in the fabrication layers of the feature during APM application.

To assist in limiting the exposure of the substrate surface to the cleaning chemistries, one or more application parameters are defined for each of the first and second cleaning chemistries based on the process parameters associated with the various fabrication layers of the features, such as gate structures, and the polymer residue contaminants. Some of the application parameters that may be defined for each of the first and second cleaning chemistries may include chemistry type, the order of application of first and second cleaning chemistry, concentration, exposure time, temperature, pressure, and flow rate. In one embodiment, exposure time may be further defined as a function of linear speed at which the substrate is transported under the proximity heads and the width of the meniscus that may be applied to the surface of the substrate. Accordingly, $F(t_{exposure\ time})$=f (Meniscus Width/surface area, substrate linear speed). The linear speed of the wafer may be controlled using mechanical devices such as a motor. For instance, if the proximity head 545 is capable of applying a meniscus that is about 20 mm wide, then the linear speed of the substrate may be adjusted to about 20 mm/sec to give an exposure time for the application of first cleaning chemistry of 1 second. Depending on the exposure time desired for each of the first and second cleaning chemistries, the linear speed of the substrate under the proximity heads may be adjusted accordingly using the motor.

Upon establishing the application parameters for the cleaning chemistries, the first and second cleaning chemistries are applied to the surface of the substrate sequentially in a controlled manner using the first and second proximity heads, 545 and 555, based on the application parameters. The order of the application of the cleaning chemistries is not rigid. In one embodiment, first cleaning chemistry (APM) is applied using the first proximity head 545 followed by the application of the second cleaning chemistry (dHF) using the second proximity head 555. In another embodiment, the first cleaning chemistry (APM) is applied using the second proximity head 555 sequentially after the application of the second cleaning chemistry (dHF) using the first proximity head 545. The order of application of the cleaning chemistries might be based on desired outcomes, such as the amount of metal oxide to be preserved. The controlled sequential application of the first and second cleaning chemistries aid in substantial removal of the polymer residue from around features, such as gate structures, without damaging the features. As mentioned earlier, the exposure time of each of the cleaning chemistries is controlled by controlling the linear speed of the substrate under the corresponding proximity heads.

The application of each of the first and second cleaning chemistries may be followed by a rinsing operation using a rinsing chemistry. The rinsing chemistry is used to remove any residual cleaning chemistry applied to the substrate surface after the respective cleaning operation. Consequently, the order of treatment of various chemistries, in one embodiment of the invention, may include application of first cleaning chemistry, rinsing operation with a rinsing chemistry, application of second cleaning chemistry and rinsing operation with a rinsing chemistry. The rinsing operation following the application of each of the first and second cleaning chemistries may use the same rinsing chemistry or different rinsing chemistries.

The first and second proximity heads (545, 555) are configured to deliver the cleaning chemistry and the rinsing chemistry as menisci to clean and rinse the surface of the substrate. The cleaning chemistry and rinsing chemistry menisci may be connected or separated. In one embodiment, the cleaning chemistries and rinsing chemistry menisci are connected. The proximity heads (545, 555) are configured to enable connection between the cleaning chemistry meniscus and rinsing chemistry meniscus. In this embodiment, the applied cleaning chemistries are used once and not reclaimed after the application. In another embodiment, the cleaning chemistries and rinsing chemistry menisci are separate. In this embodiment, each of the proximity heads (545, 555) is configured such that the cleaning chemistry meniscus is kept distinct from the rinsing chemistry meniscus. Accordingly, in this embodiment, the applied cleaning chemistry can be reclaimed after application for re-use in subsequent cleaning operations.

Each of the first and second proximity heads, 545, 555, is further configured to provide a drying operation to dry the surface of the substrate after the cleaning and rinsing operations, in one embodiment of the invention. The drying operation may include application of a drying chemistry, such as isopropyl alcohol (IPA) vapor, to the substrate surface. In one embodiment, the drying operation is optional after the first cleaning and rinsing operation. In the embodiment, where the drying operation is not performed after the application of the first cleaning chemistry and rinsing chemistry, a film of deionized water (DIW) is left on the surface of the substrate so as to prevent premature drying and/or further contamination. The drying operation is, however, included after the second cleaning and rinsing operation.

During the cleaning process, the substrate is made to move radially under the proximity heads (545, 555), to ensure even application of various chemistries to all portions of the substrate surface. In this embodiment, the size of the proximity heads is smaller than the width of the substrate. The speed of rotation of the substrate underneath the proximity heads is adjusted based on desired exposure time and the target removal rate of the polymer residue.

In another embodiment, the proximity heads are configured to have a head that is slightly larger than the diameter of the substrate so as to provide a more localized application of the cleaning chemistries with short exposure time. In this embodiment, the substrate is moving linearly under the proximity heads.

Figures 6A, 6B:
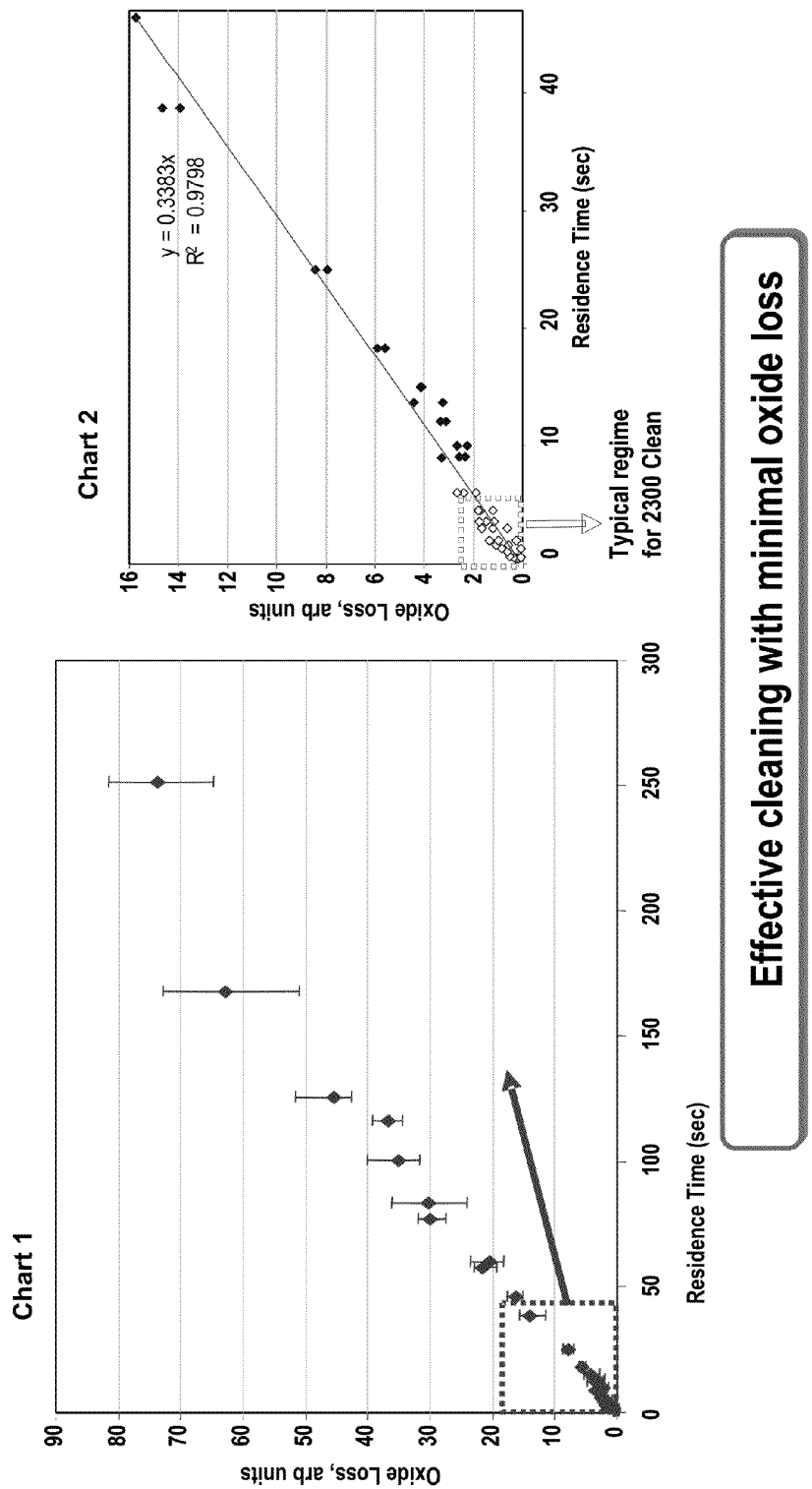
FIGS. 6A and 6B illustrate graphs identifying effective removal rate of polymer residue using the first and second cleaning chemistry, in one embodiment of the invention.
Figure 7:
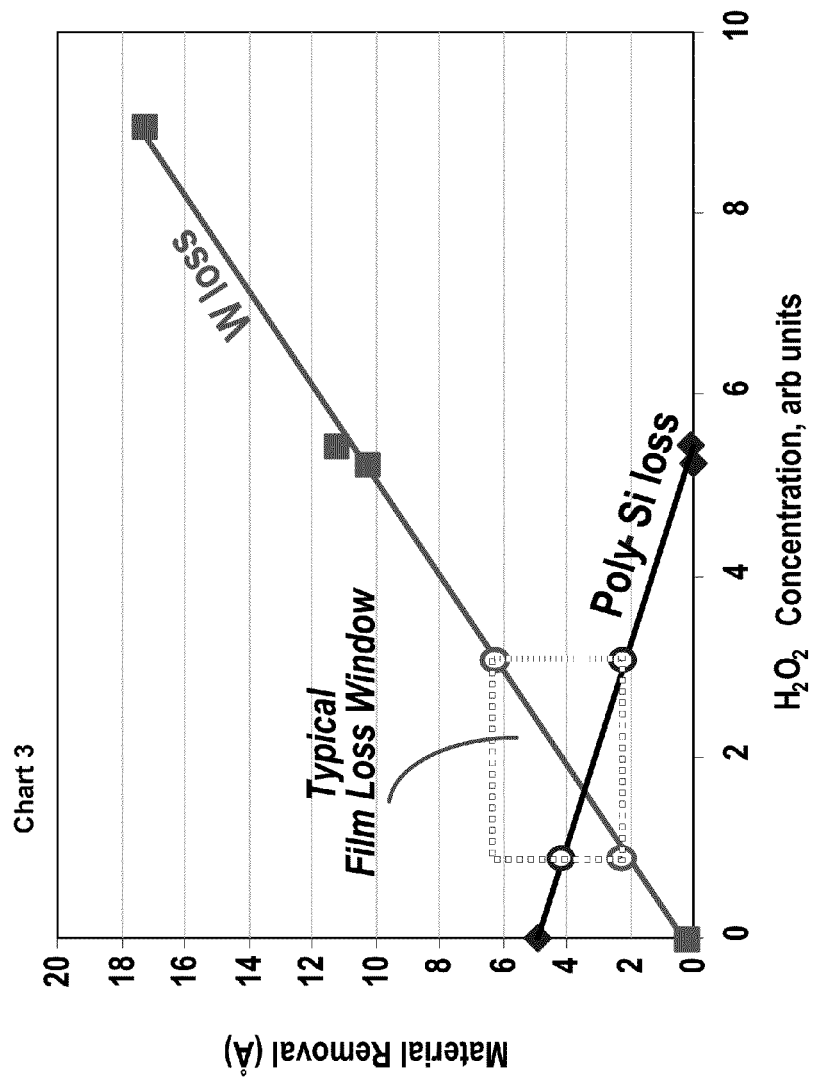
FIG. 7 illustrates the optimal exposure time and carrier speed required for effective removal of metal containing polymer residue removal, in one embodiment of the invention.
Figure 8:
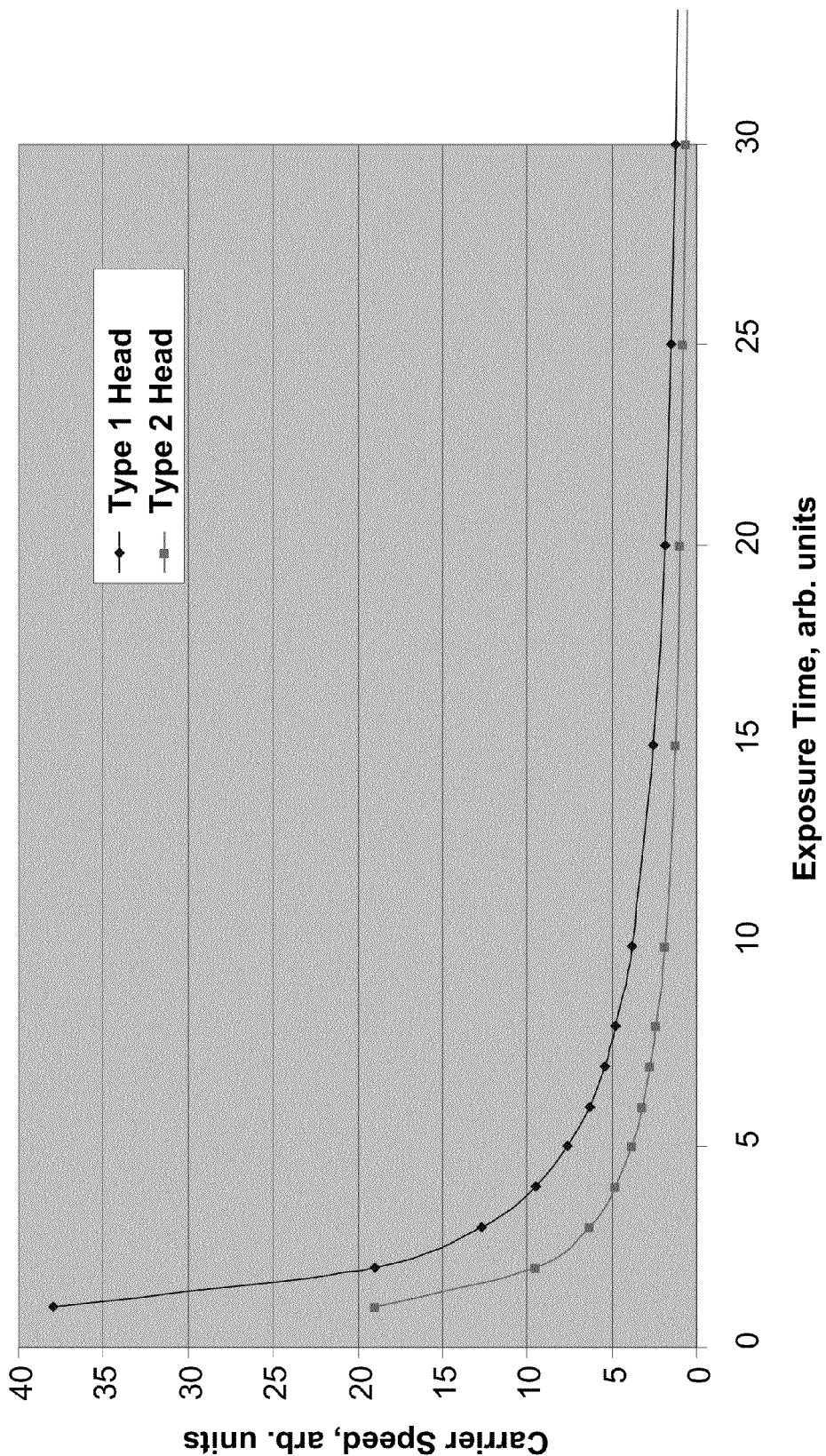
FIG. 8 illustrates the optimum concentration for effective metal containing polymer residue removal rate, in one embodiment of the invention.

The short exposure time using proximity heads allows use of concentrated and aggressive chemistries in the cleaning process. The high flow conditions of the aggressive chemistries and the subsequent displacement with rinsing chemistries enables faster reaction with the polymer residue contaminants and faster suspension of the reaction thereby enabling optimal removal of the polymer residue contaminants while minimizing the exposure of the features to the aggressive chemistries thereby preventing pullback and undercut of fabrication layers of the features, such as the gate structures during the cleaning process. Thus, for instance, APM can be used to remove metal polymer residues around a metal gate structure where tungsten/tungsten compound is used. Even though APM is known to dissolve tungsten very quickly, the controlled exposure time enables efficient removal of polymer residue while preserving the features around which the polymer residues are formed. FIGS. 6A, 6B and 7 illustrate charts 1, 2, and 3, respectively, depicting the residue cleaning rate with minimum oxide layer loss. As can be seen in FIG. 6A, for instance, the concentration of the APM may be adjusted to provide an etch rate of about 1 Å/sec to about 10 Å/sec with an optimal etch rate of about 5 Å/sec. The material loss in the gate structure can be between about 5 Å and about 10 Å with about 5 second exposure time. The concentration of the APM and the exposure time may be adjusted to obtain acceptable range of polymer residue removal while maintaining low material loss of the gate structure material. The exposure time can be adjusted using precision controls to fine tune the exposure time to an order of about ±0.1 seconds. For instance, a typical range of the composition of APM could be in the order of about 1:1:1 on the concentrated side to about 1:4:50 on the diluted side with a standard concentration of about 1:4:10. For dHF, the range of concentration could be between about 1:10 on the concentrated side to about 1:1000 for diluted side with a standard concentration of about 1:100. The standard exposure time would be about 2 seconds with a range between about 1 second to about 20 second. Depending on the proximity head size, the speed of the substrate may be adjusted to provide the required exposure time. The proximity head width could be between about 10 mm to about 40 mm and the speed of the substrate could be adjusted to the required exposure time. FIG. 8 illustrates a graph of the target exposure time to carrier speed for effective removal of polymer residue contaminants.

The graph illustrated in FIG. 8 depicts the scanning speed against exposure time for effective removal of the polymer residue contaminants with two different proximity head widths. The graph identifies the target removal rate of the polymer residue. Based on the desired removal rate, the concentration of the first and second application chemistries, speed of the substrate under the proximity heads and exposure time can be adjusted. For instance, if it is desired to remove 5 Å of tungsten based residue, the graph identifies the optimal exposure time and speed of the substrate to achieve that goal.

As mentioned earlier, FIGS. 3D, 3E and 4D illustrate the resultant metal gate structure before and after a cleaning operation is performed, in one embodiment of the invention. As can be seen in FIG. 3D illustrates a typical gate structure with polymer residue contaminants formed around the gate structure. FIG. 3E illustrates the result of a traditional cleaning operation using aggressive chemistries. The polymer residue on top of a hardmask layer is stripped with severe erosion of hardmask layer, thereby exposing the underlying layers. FIG. 4D illustrates the result after a cleaning operation using the first and second cleaning chemistries of the present invention. The precise delivery and controlled exposure of the first and second cleaning chemistries to the substrate surface enables efficient removal of the polymer residue formed on top of the hardmask without causing any negative effects on the hardmask layer. Additionally, the controlled exposure of the cleaning chemistries enables removal of the polymer residue formed on the sidewalls of the metal gate structure while substantially preserving the metal layers of the gate structure.

Figure 9:
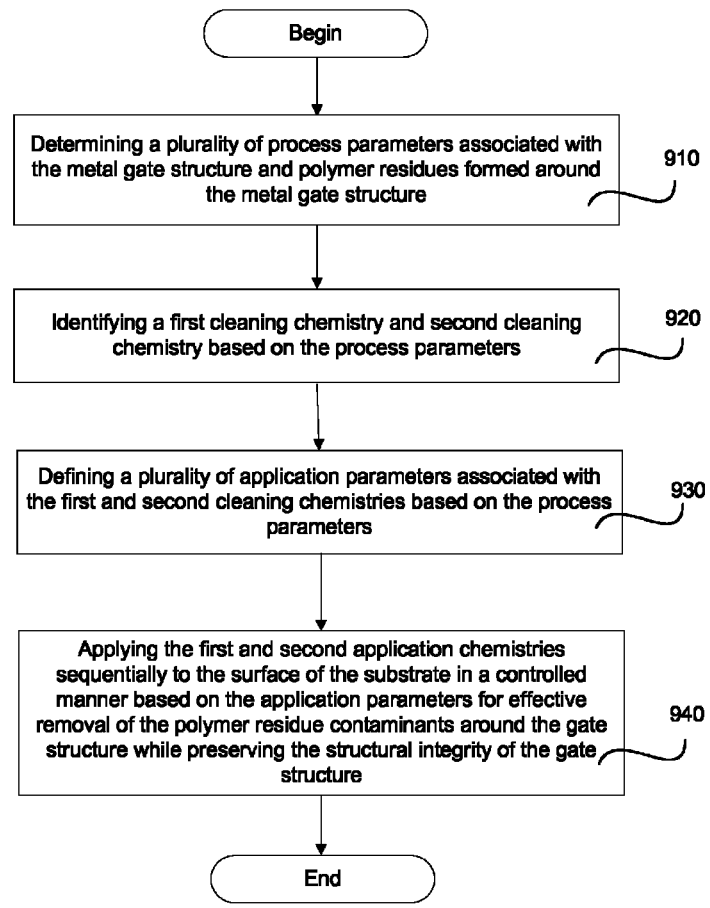
FIG. 9 illustrates various method operations involved in removing polymer residue from around a metal gate structure during post-etch cleaning operation, in one embodiment of the invention.

FIG. 9 illustrates the process operations involved in removing polymer residue from around a metal gate structure during post-etch cleaning operation, in one embodiment of the invention. The process begins at operation 910, wherein a plurality of process parameters associated with the metal gate structure and polymer residue formed around the metal gate structure, are determined. The metal gate structure may be a multi-layer structure formed using various fabrication operations. The process parameters are obtained by analyzing the fabrication layers that form the gate structure and by analyzing the polymer residue formed around the gate structure. The process parameters may include type, size, composition, temperature associated with each of the fabrication layers and of the polymer residue and target removal rate associated with the polymer residue to be removed. The process parameters define characteristics of each of the fabrication layers that comprise the gate structure and the polymer residue to be removed.

A first cleaning chemistry and second cleaning chemistry are identified based on the process parameters, as illustrated in operation 920. The first and second cleaning chemistry may be aggressive cleaning chemistries and may include Ammonium peroxide mixture (APM) and dilute Hydrofluoric acid (dHF). The examples for first and second cleaning chemistry are exemplary and are not restricted to APM and dHF but may include other aggressive chemistries that are known to dissolve or effectively react to substantially remove the metal polymer residues. Some of the other aggressive chemistries that may be used as cleaning chemistries may include, for example, a mixture of Hydrofluoric and Hydrochloric acids (HF/HCl).

A plurality of application parameters associated with the first and second cleaning chemistries are defined based on the plurality of process parameters, as illustrated in operation 930. Some of the application parameters associated with each of the first and second cleaning chemistries may include type, concentration, exposure time, temperature, pressure, and flow rate. In addition, the application parameters may include speed of the substrate under a first and a second set of proximity heads and the width of the meniscus at each proximity head. The exposure time may be calculated as a function of the speed of the substrate and the width of the meniscus at each proximity head. The application parameters are defined based on the target removal rate of the polymer residue from around the metal gate structure.

The process concludes with the application of the first and second cleaning chemistries sequentially in a controlled manner using the application parameters, as illustrated in operation 940. The application of the first and second cleaning chemistries enables substantial removal of the polymer residue from around the metal gate structure while substantially preserving the structural integrity of the metal gate structure. The application of the first and second cleaning chemistries may be accomplished through a computing system that is communicatively connected to the first and second proximity heads. One or more precision controls, available at a chemistry application mechanism communicatively connected to the proximity heads, may be manipulated using a software in the computing system to enable controlled application of the first and second cleaning chemistries so as to optimally remove the polymer residue from around the metal gate structure on the surface of the substrate while substantially preserving the structural integrity of the one or more fabrication layers that make up the gate structure. The applied cleaning chemistries may be reclaimed so that they can be re-used in subsequent cleaning operations thereby enabling optimal use of the simple but expensive cleaning chemistries. Thus, the various embodiments of the invention provide ways to remove polymer residues from around metal gate structures while preserving the structural integrity of the metal gate structure using aggressive chemistries that are known to easily dissolve the metal used in the metal gate structures.

For more information on a substrate supporting device, such as a wafer carrier, reference can be made to U.S. patent application Ser. No. 11/743,516, entitled "HYBRID COMPOSITE WAFER CARRIER FOR WET CLEAN EQUIPMENT", filed on May 2, 2007, and assigned to the Assignee of the subject application and is incorporated herein by reference.

For additional information with respect to the proximity head, reference can be made to an exemplary proximity head, as described in the U.S. Pat. No. 6,616,772, issued on Sep. 9, 2003 and entitled "METHODS FOR WAFER PROXIMITY CLEANING AND DRYING." This U.S. patent, which is assigned to Lam Research Corporation, the assignee of the subject application, is incorporated herein by reference.

For additional information about menisci, reference can be made to U.S. Pat. No. 6,998,327, issued on Jan. 24, 2005 and entitled "METHODS AND SYSTEMS FOR PROCESSING A SUBSTRATE USING A DYNAMIC LIQUID MENISCUS," and U.S. Pat. No. 6,998,326, issued on Jan. 24, 2005 and entitled "PHOBIC BARRIER MENISCUS SEPARATION AND CONTAINMENT." These U.S. Patents, which are assigned to the assignee of the subject application, are incorporated herein by reference in their entirety for all purposes.

For additional information about top and bottom menisci, reference can be made to the exemplary meniscus, as disclosed in U.S. patent application Ser. No. 10/330,843, filed on Dec. 24, 2002 and entitled "MENISCUS, VACUUM, IPA VAPOR, DRYING MANIFOLD." This U.S. patent, which is assigned to Lam Research Corporation, the assignee of the subject application, is incorporated herein by reference.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for preparing a surface of a substrate by removing post etch polymer residue from etched surfaces that define gate structure formed from at least one layer of tungsten metal, comprising:
    applying a first cleaning chemistry of an ammonium peroxide mixture (APM) as a first meniscus to the surface of the substrate for a first pre-defined exposure time so as to etch an amount of post etch polymer residue that includes tungsten metal at an etch rate ranging between about 1 Å/sec to about 10 Å/sec, the first pre-defined exposure time determined by a linear speed of the substrate moving under the first meniscus and a first width of the first meniscus that is less than a diameter of the substrate;
    applying a second cleaning chemistry of diluted Hydrofluoric acid (dHF) as a second meniscus to the surface of the substrate sequentially after the first meniscus so as to substantially remove post etch polymer residue that includes silicon metal residues left behind by one or more fabrication operations, the second cleaning chemistry being applied for a second pre-defined exposure time determined by the linear speed of the substrate moving under the second meniscus and a second width of the second meniscus that is less than the diameter of the substrate, the application of dHF used to substantially remove the post etch polymer residue that includes silicon oxide,
    wherein the first and second menisci are applied in a controlled manner using one or more proximity heads that cover a portion of the substrate, the first meniscus and the second meniscus each have a length that extends to at least a diameter of the substrate, the first meniscus and the second meniscus each define a chemical region wherein portions of the surface of the substrate covered by the first meniscus and the second meniscus are exposed to the respective first and second cleaning chemistries and the second meniscus moves together with the first meniscus at the linear speed of the first meniscus.

2. The method of claim 1, wherein the first cleaning chemistry is applied through a first proximity head and the second cleaning chemistry is applied through a second proximity head, wherein the first and the second proximity heads are configured to perform a rinsing operation following the application of each of the first and the second cleaning chemistry to the surface of the substrate.

3. The method of claim 2, wherein applying the first and second cleaning chemistries further includes performing a drying operation following the application of the second cleaning chemistry and the rinsing operation.

4. The method of claim 2, wherein the application of the first and the second cleaning chemistry further including reclaiming the first and second cleaning chemistries after application to the surface of the substrate, the reclaimed first and second cleaning chemistries re-circulated in subsequent cleaning operations.

5. The method of claim 1, wherein the gate structure is made of one or more layers of metal including one or more of tungsten, tungsten silicide, tungsten nitride, polysilicon, silicon oxide, aluminum oxide, hafnium oxide, silicon nitride, tantalum nitride or combinations thereof.

6. The method of claim 1, wherein the linear speed of the substrate is adjusted based on a size of the one or more proximity heads applying the first cleaning chemistry and the first width of the first meniscus.

7. The method of claim 1, wherein the composition of the APM ranges between about 1 volume of ammonium hydroxide to 1 volume of hydrogen peroxide to 1 volume of deionized water and about 1 volume of ammonium hydroxide to 4 volumes of hydrogen peroxide to 50 volumes of deionized water and the composition of the dHF ranges between about 1:10 and about 1:1000.

8. A method for preparing a surface of a substrate by removing post etch polymer residue from etched surfaces that define a gate structure formed from at least one layer of tungsten metal, comprising:
    applying a first cleaning chemistry of diluted Hydrofluoric acid (dHF) as a first meniscus to the surface of the substrate for a first pre-defined exposure time to substantially remove the post etch polymer residue that includes silicon metal residues left behind by one or more fabrication operations, the first pre-defined exposure time determined by a linear speed of the substrate moving under the first meniscus and a first width of the first meniscus that is less than a diameter of the substrate;
    applying a second cleaning chemistry of an ammonium peroxide mixture (APM) as a second meniscus to the surface of the substrate for a second pre-defined exposure time so as to etch an amount of the post etch polymer residue containing tungsten metal at an etch rate ranging between about 1 Å/sec to about 10 Å/sec, the second cleaning chemistry applied sequentially after the application of the first cleaning chemistry, the second pre-defined exposure time determined by the linear speed of the substrate moving under the second meniscus and a second width of the second meniscus that is less than the diameter of the substrate,
    wherein the first and second cleaning chemistries are applied in a controlled manner using one or more proximity heads, the first meniscus and the second meniscus each have a length that extends to at least a diameter of the substrate, the first meniscus and the second meniscus each define a chemical region wherein portions of the surface of the substrate covered by the first meniscus and the second meniscus are exposed to the respective first and second cleaning chemistries, and the second meniscus moves together with the first meniscus at the linear speed of the first meniscus.

9. The method of claim 8, wherein the linear speed of the substrate is adjusted based on a size of the one or more proximity heads applying the second cleaning chemistry and the second width of the second meniscus.

10. The method of claim 8, wherein composition of the APM ranges between about 1 volume of ammonium hydroxide to 1 volume of hydrogen peroxide to 1 volume of deionized water and about 1 volume of ammonium hydroxide to 4 volume of hydrogen peroxide to 50 volume of deionized water and composition of the dHF ranges between about 1:10 and about 1:1000.

11. A method for preparing a surface of a substrate by removing post etch polymer residue from etched surfaces that define gate structure formed from at least one layer of tungsten metal, comprising:

applying a first cleaning chemistry of an ammonium peroxide mixture (APM) with a composition ranging between about 1 volume of ammonium hydroxide to 1 volume of hydrogen peroxide to 1 volume of deionized water and about 1 volume of ammonium hydroxide to 4 volume of hydrogen peroxide to 50 volume of deionized water as a first meniscus to the surface of the substrate for a pre-defined exposure time of up to about 5 seconds so as to etch an amount of post etch polymer residue that includes tungsten metal at an etch rate ranging between about 1 Å/sec to about 10 Å/sec, the pre-defined exposure time defined by a linear speed of the substrate moving under the first meniscus and a defined width of the first meniscus;

applying a second cleaning chemistry of diluted Hydrofluoric acid (dHF) with a composition ranging between about 1:10 and about 1:1000 as a second meniscus to the surface of the substrate sequentially after the first meniscus, the application of dHF used to remove the post etch polymer residue that includes silicon oxide, wherein the first and second cleaning chemistries are applied in a controlled manner using one or more proximity heads, the first meniscus and the second meniscus each extend to at least a diameter of the substrate and have a defined width covering a portion of the surface of the substrate that is less than an entire surface of the substrate, the first meniscus and the second meniscus each define a chemical region wherein portions of the surface of the substrate covered by the first meniscus and the second meniscus are exposed to the respective first and second cleaning chemistries.

* * * * *